United States Patent
Naso et al.

(10) Patent No.: US 7,145,799 B2
(45) Date of Patent: *Dec. 5, 2006

(54) CHIP PROTECTION REGISTER UNLOCKING

(75) Inventors: Giovanni Naso, Frosinone (IT); Pietro Piersimoni, Avezzano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/170,880

(22) Filed: Jun. 30, 2005

(65) Prior Publication Data

US 2005/0237804 A1    Oct. 27, 2005

Related U.S. Application Data

(63) Continuation of application No. 10/698,752, filed on Oct. 31, 2003, now Pat. No. 6,947,323.

(30) Foreign Application Priority Data

Jan. 30, 2003  (IT)  ................ RM2003A0039

(51) Int. Cl.
*G11C 16/22* (2006.01)
(52) U.S. Cl. ............................ 365/185.04; 365/185.02
(58) Field of Classification Search ........... 365/185.02, 365/185.04, 185.11, 185.29, 78; 711/163
See application file for complete search history.

(56) References Cited

U.S. PATENT DOCUMENTS

| | | | |
|---|---|---|---|
| 5,592,641 A | 1/1997 | Fandrich | |
| 5,991,197 A | 11/1999 | Ogura | |
| 6,026,016 A | 2/2000 | Gafken | |
| 6,031,757 A | 2/2000 | Chuang et al. | |
| 6,469,928 B1 | 10/2002 | Takata | |
| 6,654,272 B1 | 11/2003 | Santin et al. | |
| 6,654,847 B1 | 11/2003 | Roohparvar et al. | |
| 6,711,701 B1 | 3/2004 | Roohparvar et al. | |
| 6,947,323 B1* | 9/2005 | Naso et al. ............ 365/185.04 |
| 2003/0223281 A1 | 12/2003 | Roohparvar | |
| 2004/0083346 A1 | 4/2004 | Chevallier | |

* cited by examiner

Primary Examiner—Tan T. Nguyen
(74) Attorney, Agent, or Firm—Leffert Jay & Polglaze, P.A.

(57) ABSTRACT

An improved Flash memory device is described with a protection register lock bit erase enable circuit. A bond pad coupled to the lock bit erase enable circuit of the improved Flash memory is not bonded when the individual Flash memory chip wafer is packaged. This allows the memory manufacturer to access the bond pad and erase the lock bits while the chip is still in wafer form via a test card probe, but makes the lock bits effectively uneraseable when the chip wafer is packaged. This enables the memory chip manufacturer to enhance reliability and fault tolerance of the Flash memory device by thoroughly testing the lock bits and protection register functionality. Additionally, the lock bit erase enable circuit increases manufacturing flexibility by allowing the memory chip manufacturer to reprogram the protection register and lock bits in case of organizational changes or inadvertent or erroneous programming of the protection register.

29 Claims, 5 Drawing Sheets

CHIP PROTECTION REGISTER UNLOCKING

RELATED APPLICATION

This application is a Continuation of U.S. application Ser. No. 10/698,752, filed Oct. 31, 2003 now U.S. Pat. No 6,947,323, titled "CHIP PROTECTION REGISTER UNLOCKING," which is commonly assigned and incorporated herein by reference. U.S. patent application Ser. No. 10/698,752 claims priority to Italian Patent Application Serial No. RM2003A000039, filed Jan. 30, 2003, titled "CHIP PROTECTION REGISTER UNLOCKING," which is commonly assigned.

TECHNICAL FIELD OF THE INVENTION

The present invention relates generally to integrated circuits and in particular the present invention relates to protection registers of Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

Two common types of Flash memory array architectures are the "NAND" and "NOR" architectures, so called for the logical form the basic memory cell configuration each is arranged in. In the NOR array architecture, the floating gate memory cells of the memory array are arranged in a matrix. The gates of each floating gate memory cell of the array matrix are coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing a differing current if in a programmed state or not programmed state from a coupled source line to the coupled column bit lines.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are arranged together in groups, typically of 16 each, where the memory cells coupled together in series, source to drain, between a source line and a column bit line. The NAND architecture floating gate memory array is then accessed by a row decoder activating a row of floating gate memory cells by selecting the word select line coupled to their gates. In addition, the word lines coupled to the gates the unselected memory cells of each group are driven to operate the unselected memory cells of each group as pass transistors, so that they pass current in a manner that is unrestricted by their stored data values. Current then flows from the source line to the column bit line through each series coupled group, restricted only by the selected memory cells of each group. Thereby placing the current encoded data values of the row of selected memory cells on the column bit lines.

Because all the cells in an erase block of a Flash memory device must be erased all at once, one cannot directly rewrite a Flash memory cell without first engaging in a block erase operation. Erase block management (EBM) provides an abstraction layer for this to the host, allowing the Flash device to appear as a freely rewrite-able device, including, but not limited to, managing the logical address to physical erase block translation mapping for reads and writes, the assignment of erased and available erase blocks for utilization, and the scheduling erase blocks that have been used and closed out for block erasure. Erase block management also allows for load leveling of the internal floating gate memory cells to help prevent write fatigue failure. Write fatigue is where the floating gate memory cell, after repetitive writes and erasures, no longer properly erases and removes charge from the floating gate.

Many modern Flash memories include special purpose "protection" registers. Protection registers are limited-size non-volatile storage areas (typically 128-bits) that are separate from the erase blocks of the Flash memory. Protection registers are typically utilized for storage of special purpose device identifiers and/or security codes that are associated with the Flash memory device and/or the data contents of its erase blocks. Once programmed, protection registers can be locked by the programming of "lock bits" that are associated with each individual protection register and/or protection register segment. With the lock bits set, the associated protection register or protection register segments are rendered unchangeable by the end-user of the device or system that incorporates the Flash memory. Lock bits are generally floating gate memory cells that have no erasure mechanism and thus cannot be erased once they are programmed. Lock bits can be incorporated into the protection register itself or can be standalone memory cells. If the Flash memory device notes that a lock bit protecting a protection register or a portion of a protection register is set, it disallows any attempts to manipulate or program the protection register or portion of protection register that is protected by the lock bit.

Figure 1:
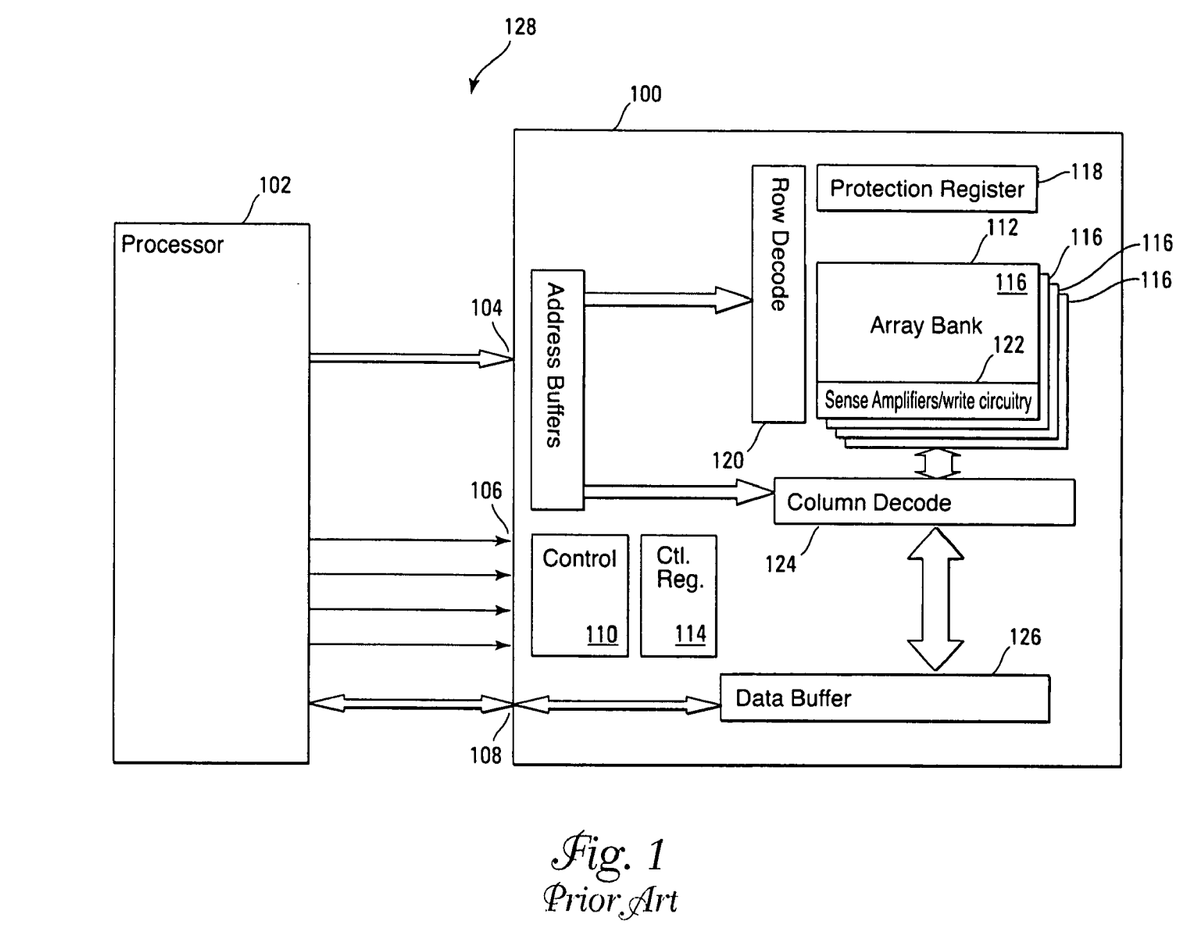
FIG. 1 details a system with a Flash memory of the prior art.

FIG. 1 shows a simplified diagram of a system incorporating a Flash memory 100 of the prior art coupled to a processing device or controller 102. In the system 128, the Flash memory 100 has an address interface 104, a control interface 106, and a data interface 108 that are each coupled to the processing device 102 to allow memory read and write accesses. Internal to the Flash memory device a control state machine 110 directs the internal operation; managing the Flash memory array 112 and updating RAM control registers and non-volatile erase block management registers 114. The RAM control registers and tables 114 are utilized by the control state machine 110 during operation of the Flash memory 100. The Flash memory array 112 contains a sequence of memory banks or segments 116 and one or more protection registers 128 and their associated lock bits (not shown). Each bank 116 is organized logically into a series of erase blocks (not shown). Memory access addresses are received on the address interface 104 of the Flash memory 100 and divided into a row and column address portions. On a read access the row address is latched and decoded by row decode circuit 120, which selects and activates a row page (not shown) of memory cells across a selected memory bank. The bit values encoded in the output of the selected row of memory cells are coupled from a local bitline (not shown) to a global bitline (not shown) and detected by sense amplifiers 122 associated with the memory bank. The column address of the access is latched and decoded by the column decode circuit 124. The output of the column decode circuit selects the desired column data from the sense amplifier outputs and coupled to the data buffer 126 for transfer from the memory device through the data interface 108. On a write access the row decode circuit 120 selects the row page and column decode circuit selects write circuitry 122. Data values to be written are coupled from the data buffer 126 to the write circuitry 122 selected by the column decode circuit 124 and written to the selected floating gate memory cells (not shown) of the memory array 112. The written cells are then reselected by the row and column decode circuits 120, 124 and sense amplifiers 122 so that they can be read to verify that the correct values have been programmed into the selected memory cells.

In the Flash memory 100 of FIG. 1, the protection registers 128 and the associated lock bits are included as part of the Flash memory array's 112 address map (its range of addressable memory cells), allowing the protection registers 128 and lock bits to be accessed for read and write operations utilizing column and row addresses as would the erase blocks of the Flash memory array 112. Each protection register 128 is maintained as a writeable/eraseable memory area of the Flash memory array 112 until the lock bit associated with the individual protection register or section of protection register is written, locking protection register 128 and its current data contents.

As stated above, protection registers are utilized in Flash memory devices to store security codes and/or device identifiers. There usually are 128 bits of protection register storage in a typical Flash memory device. Typically, one half of the Flash memory protection register, a 64 bit "factory" segment, is programmed and locked by the memory chip manufacturer with a device ID that identifies the Flash memory. The remaining half, the original equipment manufacturer or "OEM" segment, can be programmed and locked by the end-user or the manufacturer of a device or system that incorporates the Flash memory device. This user programmable portion of the Flash memory is typically utilized to implement security schemes, simplify manufacturing, and/or reduce system maintenance.

Examples of use of a Flash memory protection register include, but are not limited to, utilizing the protection register to store a unique number used to ensure that the application attempting to access a network is not "foreign." Utilizing the protection register in wireless or networked devices to program a unique identifier into each unit to identify the device to the network they are a part of. Configuring a single device design to be different end-products by enabling or disabling features of the device via configuration that is stored in the protection register. Utilizing protection registers to store checksums to detect if another identifier, password, key, or section of code in the device has been modified, allowing the device to disable itself when it recognizes that it has been tampered with. The protection register can also be utilized as a check to prevent physical changes to system components by containing codes that link specific physical components or versions of components to a system. Protection registers can also be utilized to store the manufacturing or configuration information of a device in a nonvolatile, unchangeable memory space, so that, over the lifetime of a device, when the contents of the Flash memory are upgraded or reprogrammed the device model and/or overall device configuration is not lost or the device inappropriately upgraded.

A problem with protection registers and their associated lock bit(s) in Flash memories is that they are not re-programmable. This can cause issues during manufacture of the Flash memory itself as the protection register and the associated lock bit(s) may be inadvertently programmed with an erroneous device ID or code due to mistake or an organizational or marketing change. The Flash memory devices resulting from such inadvertent protection register programming would then have to be repurposed or even possibly discarded as unsuitable. Additionally, because protection registers and their associated lock bit(s) are not generally programmable they cannot be thoroughly tested and verified during manufacture of the Flash memory device. This can increase the possibility of device failure or later unsuitability for an end user trying to program the protection register and lock bit(s) due to an error or corruption in one or more bits of the protection registers or the lock bit(s). This kind of error can be due to physical damage, impurity migration, write fatigue, electrical transients, or other such reason affecting the information stored in the floating gate memory cells of protection register and lock bits.

For the reasons stated above, and for other reasons stated below which will become apparent to those skilled in the art upon reading and understanding the present specification, there is a need in the art for a Flash memory device that has a protection register and associated lock bit(s) that can be reprogrammed once locked, yet be unchangeable to an eventual end user.

SUMMARY OF THE INVENTION

The above-mentioned problems with Flash memory device protection registers, lock bit(s), and other problems are addressed by the present invention and will be understood by reading and studying the following specification.

The various embodiments relate to Flash memory devices containing protection registers, wherein the lock bits of the protection registers are erasable while in a raw die form and are not erasable after the Flash memory device has been packaged. This is accomplished in embodiments of the present invention by a floating gate erase circuit that is coupled to the lock bits to allow for their erasure, wherein an electrical contact, such as a probe pad, a bond pad, or other, is not coupled to an external electrical connection of the final Flash memory device package. This allows the lock bits to be erased while the Flash memory device is in a raw die form by contacting the Flash memory with a test probe and utilizing the lock bit floating gate erase circuit, while preventing the activation of the erase circuit and the erasure of the lock bits after the Flash memory device has been packaged and programmed.

In one embodiment, a Flash memory device has a memory array with a plurality of floating gate memory cells arranged in a plurality of erase blocks, a protection register, one or more lock bits, and a lock bit erase circuit. In the Flash memory device, the data contents of the protection register are rendered unwriteable by the programming of the one or more lock bits. The lock bit erase circuit of the Flash memory is coupled to the one or more lock bits and the lock bit erase circuit is operable only when the Flash memory device is in wafer form.

In another embodiment, a lock bit erase circuit has a bond pad, an input buffer, a first pull down transistor, an inverter, and a floating gate erase circuit. The inverter is coupled to an output of the input buffer and to a gate of the first pull down transistor and the input of the input buffer is coupled to the bond pad. The first pull down transistor is a weak pull down transistor and is coupled to the input of the input buffer and to ground. The floating gate erase circuit is coupled to the output of the input buffer and to one or more lock bits and the bond pad does not correspond to a standard external chip I/O (input/output) of an integrated circuit chip that incorporates the lock bit erase circuit.

In yet another embodiment, a lock bit erase enable circuit has a bond pad, and an input buffer, where an input of the input buffer is coupled to the bond pad and an output of the input buffer is coupled to a floating gate erase circuit. The bond pad does not correspond to a standard external chip I/O (input/output) of a packaged Flash memory integrated circuit chip that incorporates the lock bit erase enable circuit.

In a further embodiment, a method of operating a Flash memory device enables erasure of one or more lock bits associated with a protection register when the Flash memory device is in wafer form. The Flash memory device additionally disables erasure of the one or more lock bits when the Flash memory device is in packaged form.

Other embodiments are also described and claimed.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

To improve manufacturing flexibility and allow for reprogramming of an erroneous device ID or code due to mistake, organizational, or marketing change a Flash memory of the present invention has a protection register and associated lock bit(s) that can be reprogrammed by the memory chip manufacturer once locked. This avoids the issue of Flash memory devices having to be repurposed or even discarded due to such inadvertent protection register programming. The reprogrammable lock bits of Flash memories of the present invention also allow for thorough verification and testing of the protection registers and lock bits of the memories during manufacture. This decreases the possibility of problems or device failure due to an error or corruption in one or more bits of the protection registers or the lock bit(s) from physical damage, impurity migration, write fatigue, electrical transients, or other such reason. In one embodiment of the present invention a Flash memory has one or more bond pads for an erase signals, an input buffer, and an erase circuit to erase one or more lock bits of the protection register. In another embodiment of the present invention a Flash memory has a bond pad for an erase signal, an input buffer, and an erase circuit to erase the lock bits of the protection register, wherein the bond pad is not coupled to an external pin when the Flash memory chip wafer is packaged, allowing the lock bits to be erased by the memory manufacturer by the use of a probe card when the Flash memory is in wafer form before the memory is finally packaged for use.

The present invention is applicable to numerous different integrated circuits including memory devices. One type of memory devices are synchronous memories. SDRAM's are well known in the art. Similarly, synchronous non-volatile flash memories are known, see "Protection after brown out in a synchronous memory" U.S. Pat. No. 6,246,626 by Roohparvar, issued Jun. 12, 2001, and "Protection after brown out in a synchronous memory" U.S. Pat. No. 6,366,521 by Roohparvar, issued Apr. 2, 2002, for a description of a synchronous flash memory. These U.S. Pat. Nos. 6,246,626 and 6,366,521 are commonly assigned and incorporated herein by reference.

The present invention is also applicable to numerous other forms of protectable/write once non-volatile memory cells, registers, and/or memory areas that are incorporated into various integrated circuits. One such form is an erase block protection register utilized in various Flash memory devices to protect erase blocks of the Flash memory device from being inadvertently overwritten. Examples of these erase block protection registers are described in U.S. patent application Ser. No. 09/608,256, titled "TOP/BOTTOM SYMMETRICAL PROTECTION SCHEME FOR FLASH" by Roohparvar and Widmer, filed Jun. 30, 2000, U.S. patent application Ser. No. 09/648,508, titled "WRITE AND ERASE PROTECTION IN A SYNCHRONOUS FLASH MEMORY" by Roohparvar, filed Aug. 25, 2000, and U.S. patent application Ser. No. 10/279,470, titled "COMMAND FOR PERMANENT BLOCK PROTECTION IN A FLASH MEMORY" by Chevallier and Leong, filed Oct. 24, 2002, all of which are commonly assigned and incorporated herein by reference.

Figure 2A:
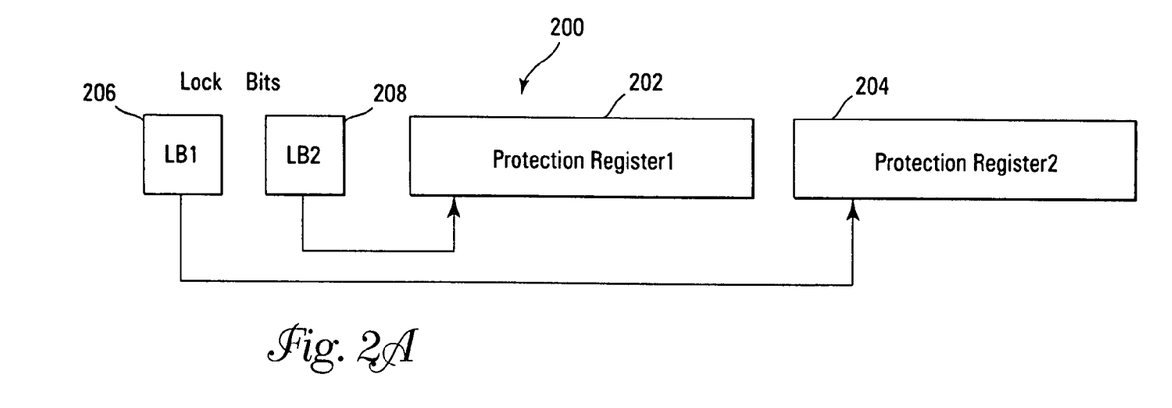
FIG. 2A details a protection register and associated lock bits of a Flash memory in accordance with an embodiment of the present invention.

FIG. 2A shows a simplified diagram of a protection register 200 of a Flash memory of an embodiment of the present invention. In FIG. 2A, the protection register 200 has a sequence of floating gate memory cells arranged into two segments, a "factory" protection register segment (protection register 1) 202 and an end user protection register or "OEM" segment (protection register 2) 204. The protection register 200 also contains two lock bits, LB1 206 and LB2 208. Lock bit LB2 208 is associated with and locks the factory protection register segment 202 when programmed. Lock bit LB1 206 is associated with and locks the OEM protection register segment 204 when programmed. Until locked by the programming of its respective lock bit 206, 208, the floating gate memory cells of each protection register segment 202, 204 can be freely written and erased. Once a lock bit 206, 208 is programmed, the associated protection register segment 202, 204 may be read but cannot be written to by the end user or end user application. The lock bits 206, 208 are a part of the protection register 200 and its segments 206, 208, and are included in the protection register 200 address space. It is noted, however, that the lock bits 206, 208 can be implemented as separate elements from the protection register 200 if desired. It is also noted that other sizes and formats of protection registers and lock bit(s) are possible and should be apparent to those skilled in the art with the benefit of the present disclosure.

Figure 2B:
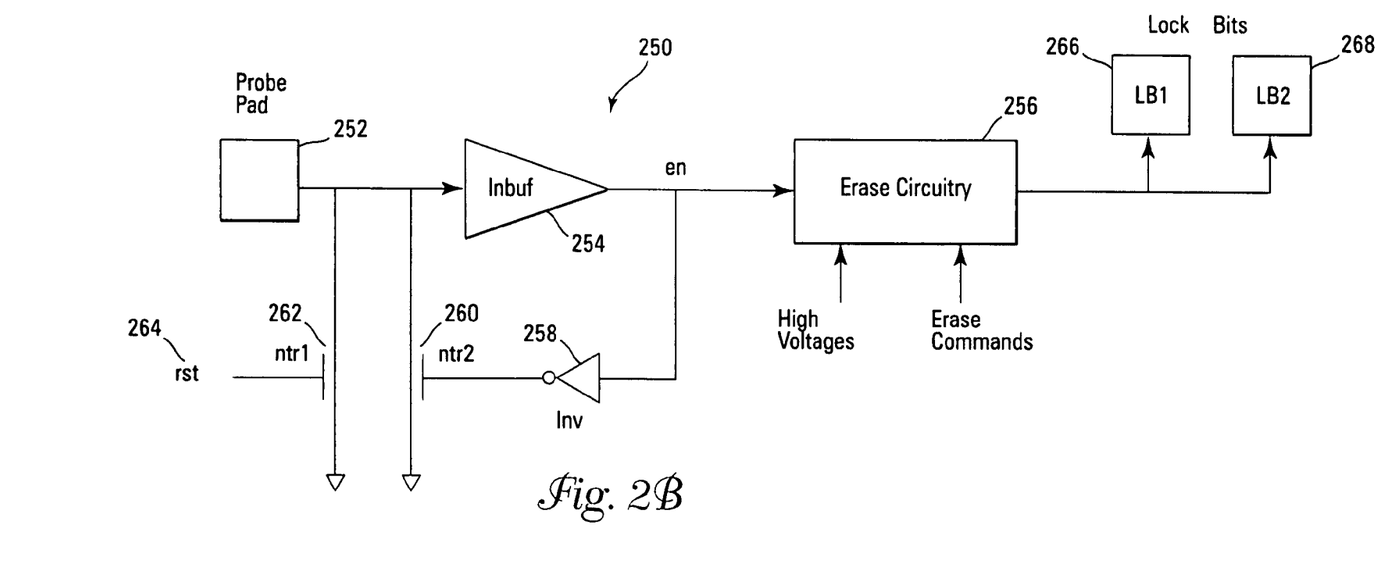
FIG. 2B details a bond pad, input buffer, and lock bit erase circuit of a Flash memory in accordance with an embodiment of the present invention.

FIG. 2B is a simplified diagram of a Flash memory device lock bit erase circuit 250 of an embodiment of the present invention. In FIG. 2B, a bond pad 252 is coupled to an input buffer 254 which is in turn coupled to a floating gate erase circuit 256. The floating gate erase circuit 256 is coupled to lock bits LB1 266 and LB2 268. A latch circuit is formed with the input buffer 254 by coupling the output of the input buffer 254 to the gate of a weak NMOS pull down transistor 260 through an inverter 258. The weak NMOS pull down transistor 260 is coupled to the input of the input buffer 254 and pulls the input down, latching the input buffer 254 to a low output state. Another NMOS pull down transistor 262 is also coupled between the bond pad and ground. The gate of the NMOS pull down transistor 262 is coupled to the reset signal 264.

During the power up or reset state, reset signal 264 is applied to NMOS pull down transistor 262 activating it. The active NMOS pull down transistor in turn pulls down the voltage signal at the bond pad 252 and the input buffer 254 input. This produces a low signal at the output of input buffer 254, which is in turn coupled through inverter 258 to turn on weak NMOS pull down transistor 260. The active weak NMOS pull down transistor 260 latches the input buffer 254 into a low initial signal output, ensuring that the erase circuit 256 is inactive by default.

When an integrated circuit chip is produced by a chip manufacturer the transistors, capacitors, interconnects and other circuit elements for a specific design are formed on a silicon wafer disk. Typically multiple integrated circuits are formed on the same silicon substrate wafer disk and then the silicon substrate wafer disk is "diced" into the individual raw integrated circuit wafer chips or dies. The individual integrated circuit wafer chips are tested and finally packaged in a ceramic or plastic exterior that contains metal connector leads that are bonded to specialized areas of the individual integrated circuit wafer chips called "bond pads" (herein defined as any electrical connection to an integrated circuit wafer or die, including but not limited to a bond pads, probe pads, or other electrical contact) and allow the integrated circuit to be connected to and utilized in a larger circuit or system. Before packaging an integrated circuit is in what is called a "wafer" form, as either part of the whole silicon substrate wafer disk or as individual raw integrated circuit wafer chip or die.

When a Flash memory chip wafer embodiment of the present invention that incorporates the Flash memory device lock bit erase circuit 250 is packaged at the memory chip manufacturer, the bond pad 252 of the Flash memory device lock bit erase circuit 250 is not bonded to an external connector or input pin of the chip package. Because of this it cannot be driven by an external signal and the lock bit erase circuit 250 will remain inactive because of the latched pull down of the input buffer 254 by the weak NMOS transistor 260 initiated at power up or reset by the NMOS pull down transistor 262. Any attempt to "decap" a packaged integrated chip wafer to gain access to the bond pads generally results in the destruction of the contained wafer chip. Therefore, once the Flash memory chip wafer is packaged, the bond pad and its coupled lock bit erase circuit 250 are inaccessible and cannot be used by the Flash memory device end user to erase the lock bits of the protection register. Thus the lock bits of the protection register, once programmed after chip packaging, are effectively uneraseable and the associated protection register or protection register segment will be rendered unwriteable once the lock bits are programmed.

For the memory chip manufacturer to erase the lock bits 266, 268 while the Flash memory chip is in wafer form (before packaging), a test card probe (not shown, such cards are well known in the art of testing semiconductor wafers) is contacted to the Flash memory chip wafer, including the bond pad 252, and a logical high voltage signal is applied to the bond pad 252 through the card probe. The logic high voltage signal overrides the weak NMOS pull down transistor 260 and activates the input buffer 254. The input buffer 254 in turn, outputs a logic high voltage signal that is coupled through the inverter 258 to the gate of the weak NMOS pull down transistor 260, deactivating it and eliminating its pull down action on the input of the input buffer 254. The logic high voltage signal from the input buffer 254 output also enables the erase circuit 256 and allows the lock bits 266, 268 to be erased. This ability to access the lock bit erase circuit 250 of a Flash memory device of the present invention while it is in wafer form permits the chip manufacturer to erase the lock bits 266, 268 of the Flash memory device and erase and reprogram their protected protection register. This enables the memory chip manufacturer to thoroughly test the lock bits and protection register of the Flash memory device, increasing overall device reliability. It also allows the memory manufacturer to reprogram inadvertently programmed protection register segments with differing codes, increasing manufacturing flexibility and reducing device wastage.

Figure 3:
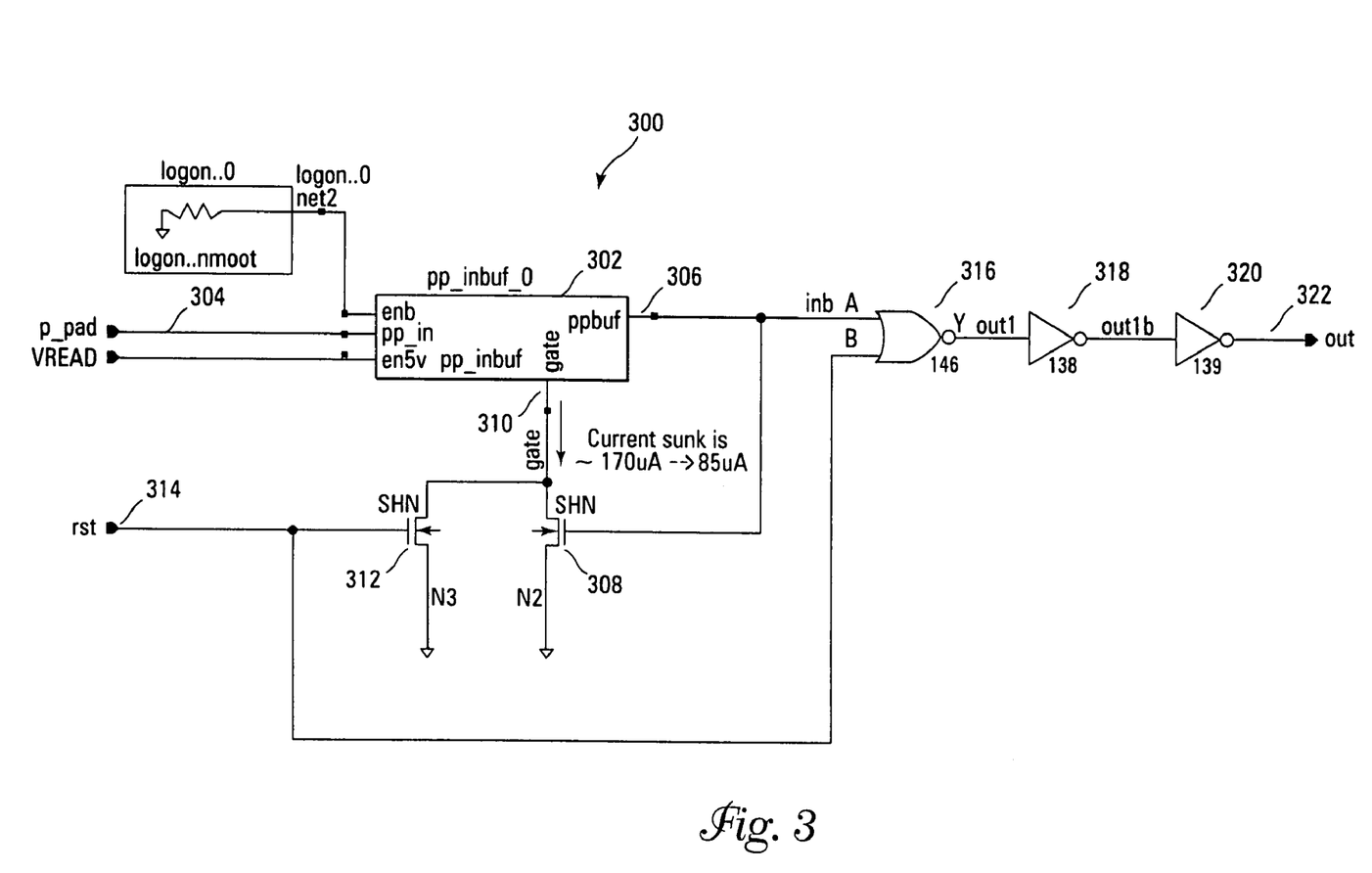
FIG. 3 details another input buffer of a Flash memory in accordance with an embodiment of the present invention.

FIG. 3 is a simplified diagram of a Flash memory device lock bit erase enable circuit 300 of another embodiment of the present invention. In FIG. 3, an inverting input buffer 302 receives a signal on signal line 304 from a bond pad. The inverted output 306 of the inverting input buffer 302 is coupled to a gate of a pull down transistor 308 and to an input the NOR gate 316. The output of NOR gate 316 is buffered through the serially coupled inverters 318 and 320 to provide an enable signal 322 for the lock bit erase circuit. The pull down transistor 308 is also coupled to an input gate 310 of the input buffer 302 and to ground. Additionally, a reset signal input 314 is coupled to the gate of pull down transistor 312 and to an input of the NOR gate 316. The pull down transistor 312 is also coupled to the gate input 310 of the input buffer 302 and to ground.

During reset or power up the reset signal input 314 is held high, activating pull down transistor 312 and disabling the output from the lock bit erase enable circuit 300 by forcing the output of NOR gate 316 low. The active pull down transistor 312 forces the output 306 of the inverting input buffer 302 high which activates pull down transistor 308 and latches the input buffer 302 output 306 to a high value. With the inverting input buffer 302 output 306 forced to a high value, the NOR gate 316 maintains a low output when the reset signal input 314 returns to a low value. Thus, by default, the lock bit erase enable circuit 300 maintains a low signal (inactive) at the enable signal output 322 and keeps the lock bit erase circuit deactivated.

When an active high lock bit erase enable signal is applied on signal line 304 via a test card probe and bond pad, the maintaining pull down input from pull down transistor 308 is overridden and the output 306 of the inverting input buffer 302 is driven low. The low signal of output 306 deactivates the latching pull down transistor 308 and places a low value signal at the input of NOR gate 316. With both the input buffer output 306 and the reset signal input low, the NOR gate 316 outputs a high signal (logical one) and enables the lock bit erase circuit by placing a high signal on the output of the lock bit erase enable circuit 300 through the serially connected inverters 318 and 320.

When a Flash memory embodiment of the present invention containing the lock bit erase enable circuit 300 in chip wafer form is packaged, the bond pad that is coupled to the input signal line 304 is not connected to an external connector of the chip package. Thus the lock bit erase enable circuit 300 will default on reset or power up to the deactivated state and the lock bits of the protection register will be effectively uneraseable once programmed.

It is noted that other protection register lock bit erase enable circuits are possible and should be apparent to those skilled in the art with benefit of the present disclosure.

Figure 4:
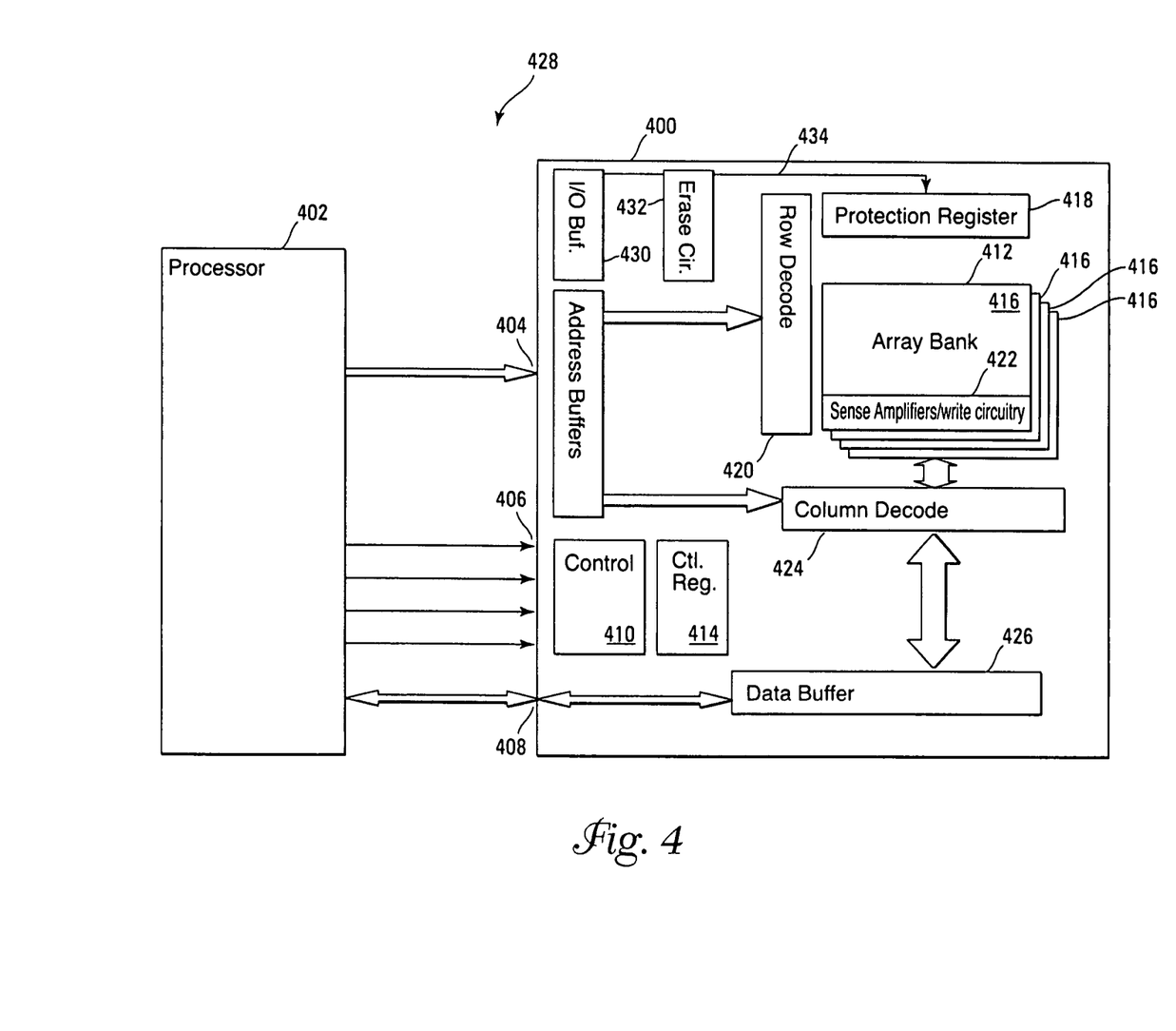
FIG. 4 details a system with Flash memory in accordance with an embodiment of the present invention.

FIG. 4 shows a simplified diagram of a system incorporating a Flash memory 400 according to an embodiment of the present invention coupled to a processing device or controller 402. In the system 428, the Flash memory 400 has an address interface 404, a control interface 406, and a data interface 408 that are each coupled to the processing device 402 to allow memory read and write accesses. Internal to the Flash memory device a control state machine 410 directs internal operation; managing the Flash memory array 412 and updating RAM control registers and non-volatile erase block management registers 414. The RAM control registers and tables 414 are utilized by the control state machine 410 during operation of the Flash memory 400. The Flash memory array 412 contains a sequence of memory banks or segments 416 and one or more protection registers 428 and their associated lock bits. Each bank 416 is organized logically into a series of erase blocks. Memory access addresses are received on the address interface 404 of the Flash memory 400 and divided into a row and column address portions. On a read access the row address is latched and decoded by row decode circuit 420, which selects and activates a row page of memory cells across a selected memory bank. The bit values encoded in the output of the selected row of memory cells are coupled from a local bitline to a global bitline and detected by sense amplifiers 422 associated with the memory bank. The column address of the access is latched and decoded by the column decode circuit 424. The output of the column decode circuit selects the desired column data from the sense amplifier outputs and coupled to the data buffer 426 for transfer from the memory device through the data interface 408. On a write access the row decode circuit 420 selects the row page and column decode circuit selects write circuitry 422. Data values to be written are coupled from the data buffer 426 to the write circuitry 422 selected by the column decode circuit 424 and written to the selected floating gate memory cells of the memory array 412. The written cells are then reselected by the row and column decode circuits 420, 424 and sense amplifiers 422 so that they can be read to verify that the correct values have been programmed into the selected memory cells.

In the Flash memory 400 of FIG. 4, the protection registers 428 and the associated lock bits are included as part of the Flash memory array's 412 address map (its range of addressable memory cells), allowing the protection registers 128 and lock bits to be accessed for read and write operations utilizing column and row addresses as would the erase blocks of the Flash memory array 412. Each protection register 428 is maintained as a writeable/eraseable memory area of the Flash memory array 412 until the lock bit associated with the individual protection register or section of protection register is written, locking protection register 428 and its current data contents.

Additionally, the Flash memory 400 of FIG. 4 contains an input buffer 430 and an erase circuit 432 coupled 434 to the lock bits of the protection registers 428. The bond pad of the input buffer 430 is not bonded to an external connector pin when the individual Flash memory wafer chip 400 is packaged. This allows the protection registers 428 to be permanently locked and not erased once the wafer chip is packaged and leaves the memory chip manufacturer. Before the Flash memory wafer chip is packaged, however, the bond pad 430 and erase circuit 432 allows the protection registers 428 and lock bits to be erased through the use of a chip test probe card. This enables the chip manufacturer to recover from inadvertent or erroneous programming, increasing manufacturing flexibility. Additionally, this allows for thorough verification testing of the protection registers 428 and associated lock bits by the memory chip manufacturer.

Figure 5:
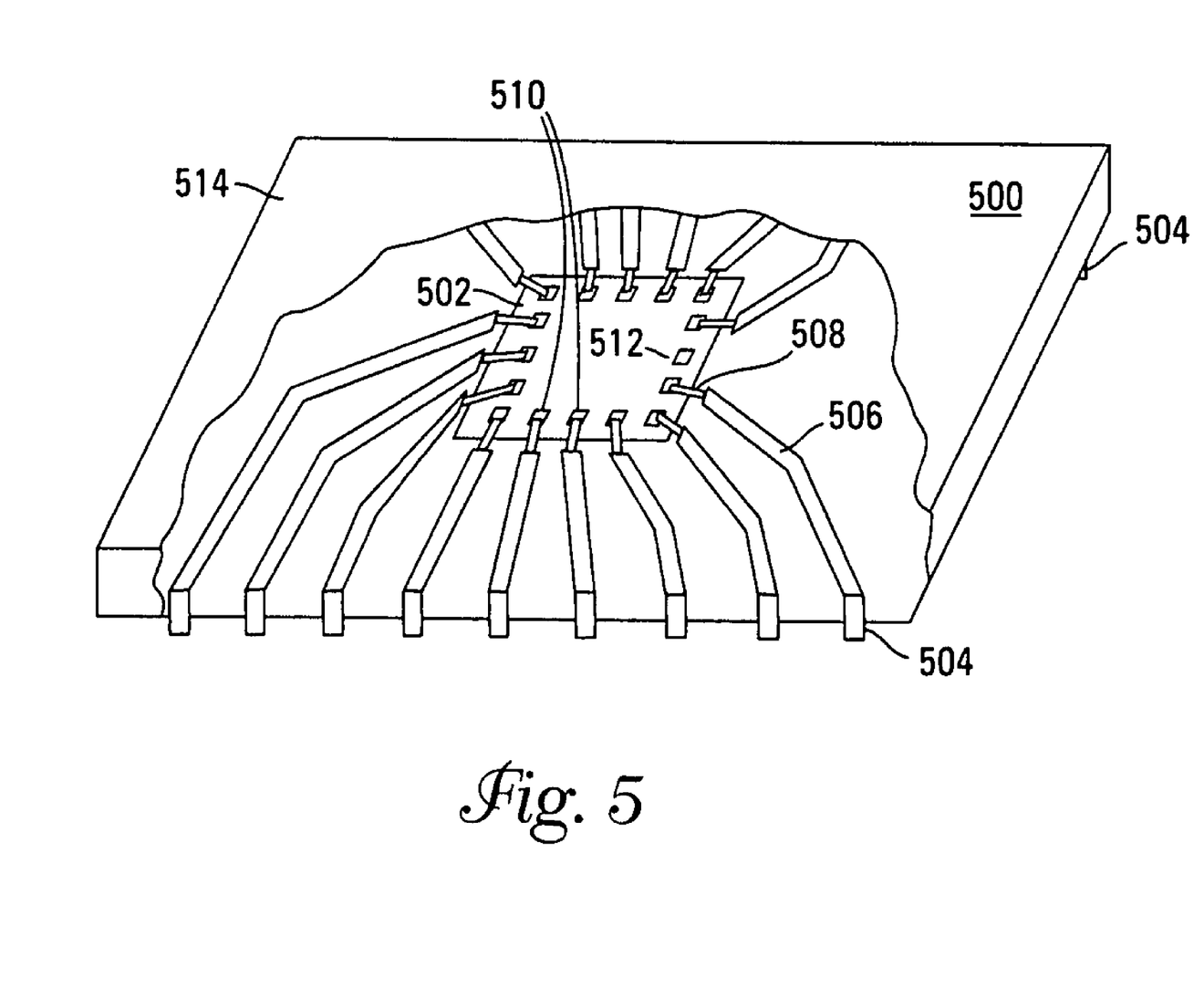
FIG. 5 details a Flash memory and a chip package in accordance with an embodiment of the present invention.

FIG. 5 shows a simplified diagram of a packaged Flash memory or integrated circuit 500 according to an embodiment of the present invention. The Flash memory package 500 incorporates a package 514, a Flash memory chip wafer 502, and a series of package/frame leads 506. The package leads 506 are coupled to external pins or connectors 504 of the packaged Flash memory 500. During the packaging process, the Flash memory chip wafer 502 is placed in the package 514 and the package leads 506 are coupled to the bond pads 510 of the Flash memory chip wafer 502 by fine "bonding" wires 508. In Flash memory embodiments of the present invention one or more bond pads 512 associated with the lock bit erase circuit are not bonded to or coupled to an exterior pin 504 of the package 514. Thus the lock bit erase bond pad(s) 512 and associated lock bit erase circuit of a packaged Flash memory 500 embodiment of the present invention is unable to be activated by the end user after the Flash memory chip wafer 502 is sealed in the package 514.

It is noted that other apparatuses and/or methods of protection register and lock bit erasure with Flash memory embodiments of the present invention are possible and should be apparent to those skilled in the art with benefit of the present disclosure.

CONCLUSION

An improved Flash memory device has been detailed with a protection register lock bit erase enable circuit. A bond pad coupled to the lock bit erase enable circuit of the improved Flash memory is not bonded when the individual Flash memory chip wafer is packaged. This allows the memory chip manufacturer to access the bond pad and erase the lock bits while the chip is still in wafer form via a test card probe, but makes the lock bits effectively uneraseable when the chip wafer is packaged. This enables the memory chip manufacturer to enhance reliability and fault tolerance of the Flash memory device by thoroughly testing the lock bits and protection register functionality. Additionally, the lock bit erase enable circuit increases manufacturing flexibility by allowing the memory chip manufacturer to reprogram the protection register and lock bits in case of organizational changes or inadvertent or erroneous programming of the protection register.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
a memory array with a plurality of non-volatile memory cells;
a register;
one or more lock bits, wherein the data contents of the register are rendered unwriteable by the programming of the one or more lock bits; and
a lock bit erase circuit, wherein the lock bit erase circuit is coupled to the one or more lock bits and wherein the lock bit erase circuit is operable only when the memory device is in wafer form.

2. The memory device of claim 1, wherein the register contains a plurality of register segments, wherein each register segment is protected by an associated lock bit of the one or more lock bits.

3. The memory device of claim 1, wherein the lock bit erase circuit comprises:
a lock bit erase enable circuit; and
an erase circuit coupled to the lock bit erase enable circuit and the one or more lock bits.

4. The memory device of claim 3, wherein the lock bit erase enable circuit comprises:
a bond pad;
an input buffer, wherein an input of the input buffer is coupled to the bond pad;
a first pull down transistor, wherein the first pull down transistor is a weak pull down transistor;
a second pull down transistor, wherein the first and second pull down transistors are each coupled to the input of the input buffer and to ground;
an inverter coupled to an output of the input buffer and to a gate of the first pull down transistor; and
a reset signal line, wherein the reset signal line is coupled to a gate of the second pull down transistor.

5. The memory device of claim 4, wherein the bond pad is not coupled to an external connector when the memory device is in packaged form.

6. The memory device of claim 1, wherein the lock bit erase circuit contains a bond pad, where the bond pad is not coupled to an external pin when the memory device is in packaged form.

7. The memory device of claim 1, wherein the register is mapped into an address range of the memory array.

8. A non-volatile memory device comprising:
a memory array with a plurality of non-volatile memory cells;
a configuration register;
one or more lock bits, wherein the data contents of the configuration register are rendered unwriteable by the programming of the one or more lock bits; and
a lock bit erase circuit, wherein the lock bit erase circuit is coupled to the one or more lock bits and wherein the lock bit erase circuit is operable only when the non-volatile memory device is not in packaged form.

9. The non-volatile memory device of claim 8, wherein the configuration register contains a plurality of configuration register segments, wherein each configuration register segment is protected by an associated lock bit of the one or more lock bits.

10. The non-volatile memory device of claim 8, wherein the lock bit erase circuit comprises:
a lock bit erase enable circuit; and
an erase circuit coupled to the lock bit erase enable circuit and the one or more lock bits.

11. The non-volatile memory device of claim 10, wherein the lock bit erase enable circuit comprises:
a bond pad;
an input buffer, wherein an input of the input buffer is coupled to the bond pad;
a first pull down transistor, wherein the first pull down transistor is a weak pull down transistor;
a second pull down transistor, wherein the first and second pull down transistors are each coupled to the input of the input buffer and to ground;
an inverter coupled to an output of the input buffer and to a gate of the first pull down transistor; and
a reset signal line, wherein the reset signal line is coupled to a gate of the second pull down transistor.

12. The non-volatile memory device of claim 11, wherein the bond pad is not coupled to an external connector when the non-volatile memory device is in packaged form.

13. The non-volatile memory device of claim 8, wherein the lock bit erase circuit contains a bond pad, where the bond pad is not coupled to an external pin when the non-volatile memory device is in packaged form.

14. The non-volatile memory device of claim 8, wherein the configuration register is mapped into an address range of the memory array.

15. A configuration register comprising:
one or more configuration register segments, each configuration register segment having an associated lock bit;
a lock bit erase circuit coupled to each lock bit;
a lock bit erase enable circuit; and
an erase circuit coupled to the lock bit erase enable circuit and to each lock bit.

16. The configuration register of claim 15, wherein the lock bit erase circuit is not operable when an integrated circuit having the protection register is in packaged form.

17. The configuration register of claim 15, wherein the configuration register is incorporated in a memory device.

18. A method of operating a memory device comprising:
  enabling erasure of one or more lock bits associated with a register when the memory device is in wafer form; and
  disabling erasure of the one or more lock bits when the memory device is in packaged form.

19. The method of claim 18, wherein enabling erasure further comprises enabling erasure by forming a lock bit erase circuit on the memory device.

20. The method of claim 18, wherein enabling erasure further comprises enabling erasure by coupling a chip test probe to a bond pad of a lock bit erase circuit when the memory is in wafer form.

21. The method of claim 18, wherein disabling erasure further comprises disabling erasure by not coupling a bond pad of a lock bit erase circuit to an external connector of the memory device in packaged form.

22. A method of erase enabling the lock bits of a register comprising:
  forming a non-volatile erase circuit coupled to one or more lock bits of a register; and
  forming a lock bit erase enable circuit coupled to the non-volatile erase circuit, wherein the lock bit enable circuit is operable only when an integrated circuit containing the register is in wafer form.

23. The method of claim 22, wherein forming the lock bit erase enable circuit further comprises:
  forming a bond pad;
  forming an input buffer, wherein an input of the input buffer is coupled to the bond pad and where an output of the input buffer is coupled to the non-volatile erase circuit.

24. The method of claim 23, wherein forming the lock bit erase enable circuit further comprises:
  forming a first pull down transistor, wherein the first pull down transistor is a weak pull down transistor;
  forming a second pull down transistor, wherein the first and second pull down transistors are each coupled to the input of the input buffer and to ground;
  forming an inverter coupled to an output of the input buffer and to a gate of the first pull down transistor; and
  forming a reset signal line, wherein the reset signal line is coupled to a gate of the second pull down transistor.

25. The method of claim 23, wherein the output of the input buffer is inverting.

26. The method of claim 25, wherein forming the lock bit erase enable circuit further comprises:
  forming a first pull down transistor, wherein a gate of the first pull down transistor is coupled the inverting output of the input buffer;
  forming a second pull down transistor, wherein the first and second pull down transistors are each coupled to a gate input of the input buffer and to ground;
  forming a reset signal line, wherein the reset signal line is coupled to a gate of the second pull down transistor; and
  forming a NOR gate coupled to the inverting output of the input buffer and to the reset signal line.

27. A memory device comprising:
  a memory array with a plurality of non-volatile memory cells;
  a means for storing configuration data;
  one or more means for locking the means for storing configuration data, wherein the data contents of the means for storing configuration data are rendered unwriteable by the programming of the one or more means for locking; and
  a means for erasing, wherein the means for erasing controls the erasing of the one or more means for locking and wherein the means for erasing is operable only when the memory device is in wafer form.

28. The memory device of claim 27, wherein the means for storing configuration data contains a plurality of segments, wherein each segment is protected by an associated means for locking of the one or more means for locking.

29. The memory device of claim 27, wherein a means for input to the means for erasing is not coupled to a means for external connection when the memory device is in packaged form.

* * * * *

UNITED STATES PATENT AND TRADEMARK OFFICE
CERTIFICATE OF CORRECTION

PATENT NO.       : 7,145,799 B2
APPLICATION NO.  : 11/170880
DATED            : December 5, 2006
INVENTOR(S)      : Naso et al.

It is certified that error appears in the above-identified patent and that said Letters Patent is hereby corrected as shown below:

Column 9, Line 48, delete "controlller 402. In the system 428, the Flash memory 400 has" and insert --controlller 402. In the system 418, the Flash memory 400 has--

Column 10, Line 20, delete "registers 428 and the associated lock bits are included as part" and insert --registers 418 and the associated lock bits are included as part --

Column 10, Line 23, delete "128 and lock bits to be accessed for read and write" and insert -418 and lock bits to be accessed for read and write--

Column 10, Line 26, delete "register 428 is maintained as a writeable/eraseable memory" and insert --register 418 is maintained as a writeable/eraseable memory --

Column 10, Line 30, delete "428 and its current data contents." and insert --418 and its current data contents.--

Column 10, Line 33, delete "lock bits of the protection registers 428. The bond pad of the" and insert --lock bits of the protection registers 418. The bond pad of the--

Column 10, Line 36, delete "This allows the protection registers 428 to be" and insert --This allows the protection registers 418 to be--

Column 10, Line 41, delete "and erase circuit 432 allows the protection registers 428 and" and insert --and erase circuit 432 allows the protection registers 418 and--

Column 10, Line 46, delete "verification testing of the protection registers 428 and" and insert --verification testing of the protection registers 418 and--

Signed and Sealed this

Fifth Day of June, 2007

JON W. DUDAS
*Director of the United States Patent and Trademark Office*